US009863040B2

United States Patent
Goela et al.

(10) Patent No.: US 9,863,040 B2
(45) Date of Patent: Jan. 9, 2018

(54) METHOD OF INCREASING ZINC SULFIDE HARDNESS

(71) Applicants: Rohm and Haas Electronic Materials LLC, Marlborough, MS (US); Dow Global Technologies LLC, Midland, MI (US)

(72) Inventors: Jitendra S. Goela, Andover, MA (US); Hangyao Wang, Pearland, TX (US); Hua Bai, Lake Jackson, TX (US); Michael A. Pickering, Dracut, MA (US)

(73) Assignees: Dow Global Technologies LLC, Midland, MI (US); Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 15/178,601

(22) Filed: Jun. 10, 2016

(65) Prior Publication Data

US 2016/0281220 A1   Sep. 29, 2016

Related U.S. Application Data

(62) Division of application No. 14/499,012, filed on Sep. 26, 2014, now Pat. No. 9,562,286.

(60) Provisional application No. 61/883,090, filed on Sep. 26, 2013.

(51) Int. Cl.
| | | |
|---|---|---|
| *C23C 16/30* | (2006.01) | |
| *C03C 17/22* | (2006.01) | |
| *C23C 16/01* | (2006.01) | |
| *C09D 1/00* | (2006.01) | |
| *C23C 16/44* | (2006.01) | |
| *G02B 1/10* | (2015.01) | |
| *C23C 16/46* | (2006.01) | |

(52) U.S. Cl.
CPC ............ *C23C 16/306* (2013.01); *C03C 17/22* (2013.01); *C09D 1/00* (2013.01); *C23C 16/01* (2013.01); *C23C 16/305* (2013.01); *C23C 16/44* (2013.01); *C23C 16/46* (2013.01); *G02B 1/10* (2013.01); *C03C 2217/288* (2013.01); *C03C 2217/78* (2013.01); *C03C 2218/152* (2013.01)

(58) Field of Classification Search
CPC .......................... C23C 16/305; C23C 16/306
See application file for complete search history.

(56) References Cited

U.S. PATENT DOCUMENTS

| | | | |
|---|---|---|---|
| 3,670,220 A | 6/1972 | Kun et al. | |
| 4,216,023 A * | 8/1980 | Kinstle | C09C 1/06 106/420 |
| 4,939,043 A * | 7/1990 | Biricik | G02B 1/10 148/33.1 |
| 4,978,577 A * | 12/1990 | Purohit | C23C 16/0218 156/153 |
| 5,242,709 A | 9/1993 | Chaffin et al. | |
| 5,365,345 A | 11/1994 | Propst et al. | |
| 6,045,728 A * | 4/2000 | Chen | G02B 1/105 264/1.21 |
| 6,582,684 B1 * | 6/2003 | Abrahamson | A61K 8/0241 424/401 |
| 6,616,870 B1 * | 9/2003 | Goela | C23C 16/01 249/115 |

FOREIGN PATENT DOCUMENTS

| | | |
|---|---|---|
| EP | 0678760 | 10/1995 |
| EP | 1363335 | 11/2003 |
| TW | 20112023 A | 1/2011 |
| WO | 2004/107192 A2 | 12/2004 |

OTHER PUBLICATIONS

Vasekar, Parag, et al., "Synthesis of zinc sulfide by chemical vapor deposition using an organometallic precursor: Di-tertiary-butyl-disulfide". Thin Solid Films, 524, (2012) 86-92.*
McCoy, John S., et al., "Effects of Temperature, Pressure, and Metal Promoter on the Recrystallized Structure and Optical Transmission of Chemical Vapor Deposited Zinc Sulfide". J. Am. Ceram. Soc., 92 (8) 1725-1731 (2009).*
Barreca, Davide, et al., "Single-Source CVD of Zinc Sulfide-Based Thin Films from Zinc bis(O-Ethylxanthate)". Chemical Vapor Deposition, 2003, 9, No. 2, pp. 93-98.*
El Hichou, A., et al., "Microstructure and cathodoluminescence study of sprayed Al and Sn doped ZnS thin films". Semiconductor Science Technology 19 (2004) 230-235.*
Search Report corresponding to Taiwan Patent Application No. 1031334599 dated Aug. 10, 2015.
Search Report corresponding to Chinese Patent Application No. 201410098875.3 dated Sep. 21, 2015.

(Continued)

*Primary Examiner* — Bret P Chen
(74) *Attorney, Agent, or Firm* — John J. Piskorski

(57) ABSTRACT

A method is directed to increasing the hardness of zinc sulfide. The hardness of zinc sulfide is increased by adding selective elements within a specified range to the crystal lattice of the zinc sulfide. The increased hardness over conventional zinc sulfide does not substantially compromise the optical properties of the zinc sulfide. The zinc sulfide may be used as a protective coating for windows and domes.

2 Claims, 1 Drawing Sheet

(56) References Cited

OTHER PUBLICATIONS

Abo-Hassan, et al., Optical characteristics of ZnSxSe1-x thin films prepared by electron beam evaporation, Thin Solid Films. (2005) pp. 117-122.
Search Report corresponding to European Application No. 14186522 dated Jan. 29, 2015.
El Hichou, et al, "Microstructure and cathodoluminescenm study of sprayed AL and SN doped ZNS thin films", Semiconductor Science and Technolgy, Nov. 1, 2007, pp. 230-235, vol. 18, No. 11.
Heime, et al, "Photoluminescence of ZnSxSe1-x Epilayers and single crystals", EDDD Transations on Electron Devices, Apr. 1, 1981, pp. 436-439, vol. 28, No. 4.

\* cited by examiner

METHOD OF INCREASING ZINC SULFIDE HARDNESS

The present application is a divisional application of co-pending application Ser. No. 14/499,012 filed Sep. 26, 2014 which claims priority to provisional application Ser. No. 61/883,090 filed Sep. 26, 2013.

FIELD OF THE INVENTION

The present invention is directed to increasing the hardness of zinc sulfide. More specifically, the present invention is directed to increasing the hardness of zinc sulfide without substantially compromising the optical properties of the zinc sulfide by adding selective amounts of specific dopants to the zinc sulfide.

BACKGROUND OF THE INVENTION

Materials such as zinc sulfide are highly desirable materials for infrared (IR) articles, such as windows and domes for high speed aeronautical vehicles which may reach transonic speeds, due to their high transmission in the visible to long wavelength infrared (LWIR) band region, i.e., 0.6 µm to 14 µm. In general, transmissions through zinc sulfide may be from around 60% and greater. However, zinc sulfide is also relatively soft which makes it unsuitable for high speed aeronautical vehicles. Such articles must withstand rain and sand impact, as well as provide high transmission in the required wavelength bands. However, zinc sulfide typically suffers considerable damage under rain and sand impact which results in loss of transmission and substantial increase in scatter. Scatter is a general physical process where radiation, such as light or moving particles, are forced to deviate from a straight trajectory by one or more localized non-uniformities in the medium through which they pass. In general, rain erosion tests are conducted in an artificial rain field of 2 mm nominal drop diameter falling at a rain rate of around 25.4 mm/hr and impacting samples at a velocity of around 210 m/sec. for an exposure time of around 20 minutes. A typical test is the Whirling Arm Rain Rig test performed by the University of Dayton Research Institute at the Wright Patterson Air Force Base, Dayton, Ohio. Tests performed on zinc sulfide have indicated that zinc sulfide suffered considerable damage when exposed to the above rain field for 5 minutes or longer.

To improve durability of zinc sulfide, coatings of hard and durable materials, such as diamond like carbon, alumina, boron nitride and gallium phosphide are applied on infrared windows of zinc sulfide. The choice of coating material depends upon the particular transmission band of interest. However, coatings may suffer from adhesion problems as well as not being uniform over the surface of the zinc sulfide article. Variation in size of the article as well as shape such as unconventional angles on the surface can make application of a coating difficult. A number of physical properties of the materials are involved when coating thicknesses are increased or when the size of the article on which the coating is deposited is changed. Typically stresses, such as tensile and compressive stress, are involved which are unpredictable in their effects as the coating thickness is changed as well as the size of the article is changed. Accordingly, there is a need for increasing the hardness of zinc sulfide which can survive the full duration of rain and sand erosion and transmit in the required wavelength bands and are durable for use in high speed aeronautical vehicles.

SUMMARY OF THE INVENTION

A composition includes zinc sulfide and 0.5 mole % to 10 mole % of one or more dopants chosen from selenium, gallium, aluminum and silicon.

A method includes providing a source of zinc, a source of sulfur and a source of one or more dopants chosen from selenium, gallium, aluminum and silicon; injecting the source of zinc as a gas at 0.2 to 1 slpm, the source of sulfur as a gas at 0.1 to 0.9 slpm and the one or more sources of selenium, gallium, aluminum and silicon as a gas at 0.01 slpm to 0.1 slpm into a chemical vapor deposition chamber including an inert gas, the pressure in the chemical vapor deposition chamber ranges from 20 to 50 Torr; and chemical vapor depositing one or more layers of the composition including zinc sulfide and 0.5 mole % to 10 mole % of the one or more dopants chosen from selenium, gallium, aluminum and silicon on a substrate, a temperature of the substrate is from 600° C. to 800° C.

Articles include a substrate and one or more layers of a composition including zinc sulfide and 0.5 mole % to 10 mole % of one or more dopants chosen from selenium, gallium, aluminum and silicon.

The compositions of zinc sulfide and the one or more dopants included in amounts of 0.5 mole % to 10 mole % increase the hardness of the zinc sulfide such that protective coatings can be avoided. Incorporating the one or more selective dopants in the specific amounts does not compromise the optical properties of the zinc sulfide. The compositions can withstand rain and sand erosion and transmit in the long wavelength infrared region of 8 µm to 12 µm, thus they can be used to make windows and domes for high speed aeronautical vehicles.

DETAILED DESCRIPTION OF THE INVENTION

Figure 1:
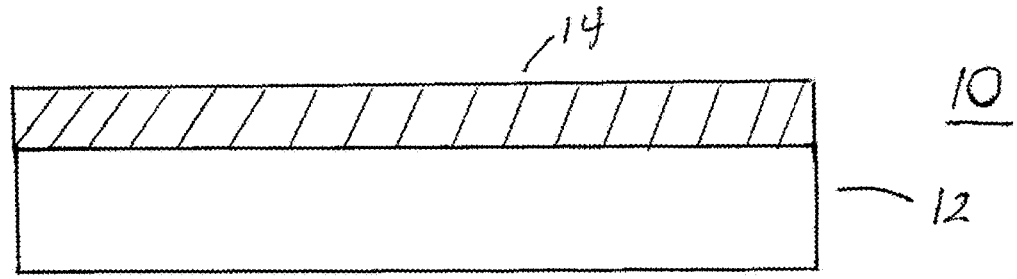
FIG. 1 illustrates an article containing a substrate coated with a layer of doped zinc sulfide.

As used throughout this specification, the following abbreviations have the following meaning, unless the context indicates otherwise: ° C.=degrees Celsius; IR=infrared; LWIR=long wavelength infrared; gm=gram; kg=kilogram; m=meter; cm=centimeter; mm=millimeter; µm=microns; nm=nanometers; Knoop=kg/mm$^2$; slpm=standard liters per minute; hr=hour; Torr=1 mm Hg=133.322368 pascals; psi=pounds/in$^2$=0.06805 atm (atmospheres); 1 atm=1.01325×10$^6$ dynes/cm$^2$; ASTM=American Standard Testing Method; CVD=chemical vapor deposition; and PVD=physical vapor deposition.

The term "stoichiometric" means that the elements of a chemical reaction combine in definite ratios and the amount of each element of the reactants is the same as each element in the product. The term "modulus" means a coefficient of a specified property of a specified substance. The terms "a" and "an" may refer to both the singular and the plural. All numerical ranges are inclusive and combinable in any order, except where it is logical that such numerical ranges are constrained to add up to 100%.

Compositions include zinc sulfide doped with 0.5 mole % to 10 mole % of one or more dopants chosen from selenium, gallium, aluminum and silicon based on the doped zinc sulfide. The addition of the dopants increases the hardness of zinc sulfide and at the same time does not substantially compromise the optical properties, such as transmission, refractive index, reflectivity and absorption of the zinc sulfide. The improved hardness of the doped zinc sulfide enables the zinc sulfide to better withstand abrasion caused by high velocity raindrops and solid particles such as sand and still maintain its optical properties. Preferably, the dopants are incorporated in the zinc sulfide in amounts of 1 mole % to 6 mole %, more preferably from 1.5 mole % to 3 mole %. Preferably the dopant is chosen from one or more of selenium, gallium and aluminum, more preferably the dopant is chosen from one or more of selenium and gallium, most preferably the dopant is selenium. When two or more dopants are incorporated into zinc sulfide, preferably one of the dopants is selenium. Preferably the selenium and the other dopants are in equal amounts, more preferably selenium dopant predominates and is incorporated in greater amounts than the other dopants.

While not being bound by theory, the incorporation of one or more of the dopants into the zinc sulfide involves a replacement of either a zinc atom or sulfur atom in the zinc sulfide crystal lattice with a dopant atom. For example, if selenium is incorporated into the zinc sulfide crystal lattice, each atom of selenium replaces a sulfur atom. If gallium, aluminum or silicon is incorporated into the zinc sulfide crystal lattice, each atom of gallium, aluminum or silicon replaces a zinc atom. The replacement of a zinc or sulfur atom for one of the dopant atoms causes a distortion of the zinc sulfide crystal lattice, thus altering the mechanical properties of the crystal lattice such as to increase the hardness of the zinc sulfide. It is believed that the hardness of the zinc sulfide caused by the distortion of the dopants is proportional to the elastic modulii such as shear modulus and Young's modulus. As the elastic modulus of a particular doped zinc sulfide increases, the hardness of the doped zinc sulfide increases.

Deposits of doped zinc sulfide may be produced in conventional CVD or PVD furnaces. Such furnaces typically are enclosed in vertically-oriented water-cooled stainless steel vacuum chamber housings. A graphite retort contains molten zinc and provides a heating means, such as resistance or radiant heating elements, at the bottom of the deposition chamber. A substrate such as a hollow mandrel, typically made of graphite, is vertically arranged above the zinc retort with its interior in flow communication with the retort. Typically the mandrel is rectangular in shape or it may be in the form of a tube. A second heating element, such as resistance heaters, capable of heating the mandrel are provided around the mandrel's exterior. Gas injectors provide hydrogen sulfide, a source of dopant, such as hydrogen selenide, trimethylgallium (TMG), trimethylaluminum (TMA), trimethylchlorosilane or mixtures thereof and inert gas, such as argon or nitrogen, to lower portions of the mandrel's interior. Gas exhaust at the top of the furnace's housing is operatively connected to a filtration system to remove particulates, then to a vacuum source, such as a vacuum pump and finally to a scrubber to remove unreacted hydrogen sulfide, dopant gases and any other toxic products. Mandrel temperature is measured by a thermocouple touching the mandrel at its external surface. Zinc temperature in the retort is measured by averaging the temperature measurements of two thermocouples, one touching the upper portion of the retort's wall, above and near the level of molten zinc, and another extending to the lower portion of the retort's wall below the level of molten zinc. Such furnaces are disclosed in U.S. Pat. Nos. 6,221,482 and 6,083,561.

Elemental zinc is vaporized in the zinc retort at temperatures greater than 575° C. The vaporized zinc is mixed with hydrogen sulfide, one or more dopant gases and a carrier gas as they enter the mandrel from the injector. Vaporized zinc flow rate is from 0.1 to 1 slpm, preferably from 0.2 to 0.5 slpm and the hydrogen sulfide flow rate is from 0.1 to 0.9 slpm, preferably from 0.2 to 0.6 slpm. Typically the flow rate of sulfur is kept at a lower flow rate than zinc during a given run. Dopant gas flow rates range from 0.01 to 0.1 slpm, preferably from 0.08 to 0.1 slpm. The mixed gases are caused to flow through the interior of the mandrel where they contact the heated interior surface of the mandrel causing zinc, hydrogen sulfide and dopant to react to form doped zinc sulfide on the interior surfaces of the mandrel. The carrier gas and any gaseous or entrained reaction products are removed from the chamber through the gas exhaust and are then processed through the filtration and scrubbing systems. Once started the process is continued until the desired thickness of the doped zinc sulfide is deposited on the mandrel. Typically deposition is greater than 15 hours and may take up to 1100 hours. More typically deposition is from 100 hours to 600 hours. Typically the mandrel temperatures range from is 620° C. or higher, preferably the mandrel temperature ranges from 660° C. to 720° C.

A stoichiometric excess of zinc is maintained in the deposition zone after an initial ramping up of the zinc vapor concentration in the gas mixture supplied to the deposition zone. A hydrogen sulfide to zinc molar ratio of less than 0.8, typically of 0.6 to 0.8 is provided after initial ramping of the zinc vapor concentration. The molar ratios of the dopant gases to the hydrogen sulfide range from 0.005 to 0.1. During the initial ramping up of the flow of zinc vapor is initiated at a minimal value at the beginning of each run and is slowly increased, or ramped up, to the target, or sustained, flow rate over the initial 10 to 90 hours and, typically, over the initial 30 to 60 hours, of the run. In general such is accomplished by initially setting and then maintaining the hydrogen sulfide, dopant gases and a carrier gas flow rates while slowly ramping up the zinc retort temperature. The zinc retort temperature is typically maintained at least 10° C. lower, more typically 15° C. lower, and most typically 20° C. lower than the mandrel temperature. In general furnace pressures are at furnace absolute pressures of less than 60 Torr, typically 30 to 40 Torr. When a desired thickness is achieved, the gas flow through the gas injector is discontinued, the first heating element is turned down, the second heating element is turned off, the chamber housing is opened and the mandrel is removed. The doped zinc sulfide deposited on the interior walls of the mandrel is then removed and cut into sheets of desired size. Conventional cutting tools, such as mechanical cutting tools or water jet cutting tools may be used.

The doped zinc sulfide sheets are machined to remove any contaminants such as graphite from the mandrel side and are machined to smooth the deposition side. Conventional machining processes may be used. Such processes include, but are not limited to, grinding, lapping and honing. Typically, the surfaces are machined with diamond tooling. A Blanchard grinder may be used. Fixed abrasive grinding may be used and typically involves using diamond, silicon carbide and other abrasives which have a Mohs hardness of 9 and higher. Combinations of such materials also may be used. The abrasive may be in particle form or in the form of a grinding wheel such as a diamond wheel. The surface speed of the wheel is at least 1000 m/minute., or such as from 2000 m/minute to 10,000 m/minute. Particles are applied at pressures of 10 psi to 100 psi, or such as from 20 psi to 80 psi.

Lapping and polishing may be done using conventional apparatus and methods, such as with various lapping apparatus, and polishing pads. When lapping plates are used, the plates turn at surface speeds of 300 m/minute to 3000 m/minute or such as from 600 m/minute to 2500 m/minute. Lapping and polishing are done at pressures of 1 psi to 15 psi, and from 1 hr to 10 hrs.

Lapping and polishing may be done with slurries, pastes and dry particles provided that the components do not include materials which would contaminate the doped zinc sulfide. Various types of particles may be used as well as particle sizes. Particles include, but are not limited to, diamond, aluminum oxide, silicon carbide, silicon nitride, boron carbide, boron nitride, carbon nitride and mixtures thereof. Particle sizes may range from 0.005 µm to 30 µm. When diamond paste is used the particles sizes may range from 2 µm or less, typically 1 µm or less. Such abrasive particles may compose 1 wt % to 30wt % of slurries. Conventional additives such as chelating agents, buffers and surfactants may be included in the slurries in conventional amounts. Lapping and polishing may be done in multiple steps of varying particle sizes to achieve the desired surface smoothness. Typically the doped zinc sulfide is lapped and polished to a scratch/dig ratio of 120/80 to 10/5, preferably 80/50 to 60/40.

The doped zinc sulfide also includes doped water clear zinc sulfide. After the doped zinc sulfide is removed from the mandrel, it is wrapped in an inert pre-cleaned foil, such as a platinum foil. The doped zinc sulfide wrapped in the cleaned inert foil is then treated by a HIP process. The HIP process involves positioning the wrapped doped zinc sulfide in a graphite crucible in a conventional HIP furnace. The furnace is first evacuated and then pressurized with an inert gas, such as argon. Heating is begun and the temperature is allowed to rise to its set point where the temperature and pressure stabilize and are maintained for the desired extended treatment time. The wrapped doped zinc sulfide is typically subjected to temperatures greater than 700° C., typically 900° C. to 1000° C., and isostatic pressures from 5,000 psi to 30,000 psi, typically from 15,000 psi to 30,000 psi, for an extended time of up to 150 hours, typically 70 to 100 hours. Upon completion of the desired treatment time, the heating is discontinued and the wrapped doped zinc sulfide is allowed to cool. Cooling is done by controlling the rate of cooling to less than 50° C. per hour, typically less than 31° C. per hour. The pressure is released in the HIP furnace after the temperature falls below 500° C. The final product is functionally transparent or low scatter doped water clear zinc sulfide. The low scatter doped water clear zinc sulfide is capable of final shaping, lapping and polishing using conventional processes as described above. Typically the doped zinc sulfide ranges in thickness from 0.1 mm to 50 mm, preferably from 1 mm to 15 mm, more preferably from 1 mm to 10 mm.

Figure 2:
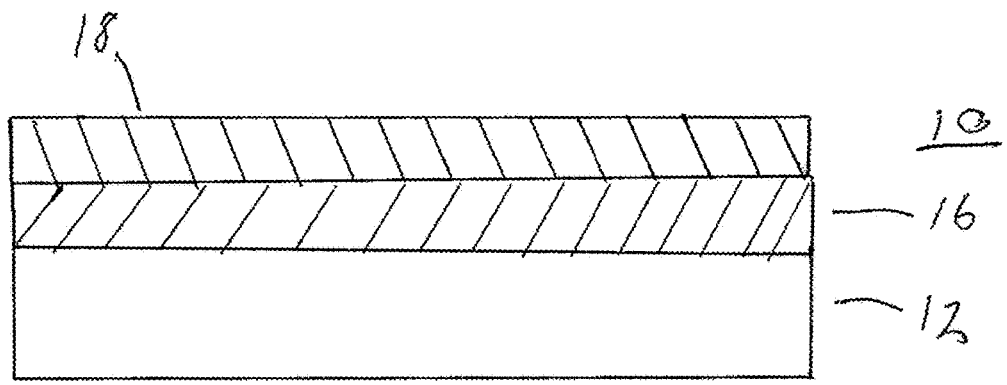
FIG. 2 illustrates an article containing a substrates coated with a plurality of doped zinc sulfide layers.
Figure 3:
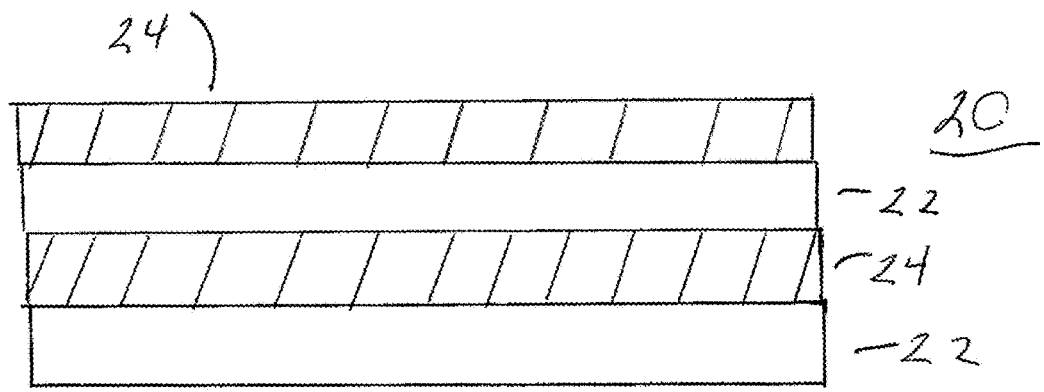
FIG. 3 illustrates an article having alternating layers of substrates and layers of doped zinc sulfide.

Alternatively, the doped zinc sulfide may be directly chemically vapor deposited on substrates such as glass, silicon carbide, zinc sulfide, zinc selenide, spinel, ALON® Optical Ceramic, sapphire, water-clear zinc sulfide, magnesium fluoride and other materials which have properties suitable for functioning as windows or domes typically found on aeronautical vehicles. FIG. 1 illustrates an article 10 having a material which may function as a window or dome 12 protected by a doped zinc sulfide layer 14. As shown in FIG. 2, the article 10 can include a plurality of doped zinc sulfide layers 16 and 18 each which may be doped with a different dopant, combination of dopants or amounts of dopants. As shown in FIG. 3 an article 20 can also include alternating layers of the window or dome material 22 and layers of the doped zinc sulfide 24. The upper window or dome material layers may be secured to the doped zinc sulfide layers by an adhesive 26. Adhesives include, but are not limited to chalcogenide and other glasses which have a close refractive index match with zinc sulfide. Such adhesives are deposited by conventional methods known in the art such as CVD, PVD and hot pressing. An example of a bonding material is As—Se—S chalcogenide glass whose refractive index is matched to that of zinc sulfide. The bonding glass is placed between the doped and window or dome and then hot pressed above the softening temperature of the glass such that the glass flows into the gap and secures the doped zinc sulfide to the window or dome. Typically, As—Se—S chalcogenide glass is used to bond doped zinc sulfide to non-doped or conventional zinc sulfide. The doped zinc sulfide layer protects the window or dome material from damage due to high velocity raindrops and particles of matter such as sand.

The compositions of zinc sulfide and the one or more dopants included in amounts of 0.5 molar % to 10 molar % increase the hardness of the zinc sulfide such that protective coatings can be avoided. The doped zinc sulfide typically has a hardness increase of at least 10% over the hardness of conventional zinc sulfide, including water-clear zinc sulfide. Preferably the doped zinc sulfide has an increased hardness over conventional zinc sulfide of greater than 30%, more preferably the doped zinc sulfide has an increased hardness of 30% to 60%. Hardness values are based on conventional hardness tests such as Knoop, Vickers and ASTM E384-11 e1. When using the Knoop hardness test to compare hardness values of the doped zinc sulfide with the conventional zinc sulfide, an average baseline hardness of 220 Knoop is generally used for conventional zinc sulfide and 160 Knoop for water clear zinc sulfide. Incorporating the one or more selective dopants in the specific amounts does not compromise the optical properties of the doped zinc sulfide and it substantially retains its transmission in the LWIR range of 8 µm to12 µm. The compositions can withstand rain and sand erosion and transmit in the LWIR range, thus they can be used to make windows and domes for high speed aeronautical vehicles.

The following examples are intended to further illustrate the invention, but are not intended to limit its scope.

EXAMPLE 1

Chemical vapor deposited zinc sulfide is produced in chemical vapor deposition chambers by the reaction of elemental zinc with hydrogen sulfide gas. The source of zinc is elemental zinc which is contained in zinc retorts heated to a temperature range of 620°-670° C. to produce zinc gas which passes into the deposition chambers through zinc holes around a central injector. Each retort is slowly ramped up to 620° C. then to 670° C. over 10 hours where it is maintained over the remainder of the deposition. A hydrogen sulfide to zinc molar ratio of 0.6 to 0.8 is provided after initial ramping of the zinc vapor concentration. Argon gas is used to carry zinc vapors to the deposition area. The zinc gas and argon flow rates are slowly increased over 30 hours after which the zinc gas flow is maintained in each chamber at 0.4 slpm and the argon is 1.5 slpm for the remainder of the deposition. Hydrogen sulfide gas is mixed with argon and injected in the deposition area through central injectors at 0.3 slpm. The zinc sulfide is deposited on graphite mandrels at temperatures ranging from 660°-720° C. and at furnace pressures of 25-40 Torr. The duration of zinc sulfide deposition is done for 200-700 hours to produce a range of thickness from 4-80 mm thick zinc sulfide articles. After the zinc sulfide deposition is completed, the material is machined with a diamond wheel at 2000 m/minute at a pressure of 10 psi. The diamond on the wheel has an average Mohs hardness of 9. The articles are then lapped at 300 m/minute at pressures of 5 psi to 6 psi, for 1 hour with silicon carbide particles having an average particle size of 15 µm. Polishing is done with a polishing pad and aqueous slurry with diamond particles having an average particle size of 1 µm at 2 psi. Polishing is done until the doped zinc sulfide surface has a scratch/dig ratio of 80/50. The hardness is measured with a Knoop indentation using 50 gram load. The hardness of the zinc sulfide deposits are measured in the range of 200-240 Knoop with an average baseline hardness of 220 Knoop.

EXAMPLE 2

Four graphite mandrels each 8 cm wide and 30 cm long are machined and coated with a release coating of amorphous carbon using standard conventional processes. The mandrels are mounted in a chemical vapor deposition chamber as an open box to deposit doped zinc sulfide. Zinc is loaded in a graphite retort and slowly heated to 640° C. over 10 hours to produce an initial 2-3 Torr of zinc vapor pressure. A hydrogen sulfide to zinc molar ratio of 0.6 to 0.8 is provided after initial ramping of the zinc vapor concentration. Sufficient quantity of argon is passed through the zinc retort to produce 0.4 slpm of zinc flow during deposition. Hydrogen selenide is the selenium source. The flow rates of the gases through the central injector during deposition are as follows: argon=1.5 slpm, hydrogen sulfide=0.3 slpm, hydrogen selenide=0.094 slpm. Deposition is done at a mandrel temperature of 690° C. and a deposition chamber pressure of 35 Torr. The deposition is terminated after 100 hours. The zinc sulfide is expected to be doped with 1.5 molar % of selenium. The deposits of zinc sulfide doped with selenium are removed from the graphite mandrels and then machined with either an alumina or diamond wheel at 3000 m/minute at a pressure of 15 psi. The alumina and diamond on the wheels have an average Mohs hardness of 10. The articles are then lapped at 300 m/minute at pressures of 5 psi to 6 psi, for 3 hours with alumina particles having an average particle size of 30.9 µm followed with average particle sizes of 9 µm. Polishing is done with a polishing pad and aqueous slurry with diamond particles having an average particle size of 2 µm at 5 psi. Polishing is done until the doped zinc sulfide surface has a scratch/dig ratio of 80/50. The hardness of the polished material is measured with a Knoop indentation using a 50 gram load. The average hardness value is expected to be 300 Knoop. This value is larger by 36% in comparison to the baseline average hardness of 220 Knoop as shown in Example 1 above. Thus doping of zinc sulfide with a 1.5 molar % concentration of selenium is expected to result in a hardness increase of about 36%.

The IR transmission of the selenium doped zinc sulfide is also measured using a Perkin Elmer IR spectrophotometer. No significant decrease in IR transmission in the long wave region of 8-12 µm is expected to be observed.

EXAMPLE 3

The chemical vapor deposition of zinc sulfide and dopant is performed in the same manner as given in Example 2 except that trimethylaluminum (TMA) is also passed through the central injector at 0.094 slpm during deposition. TMA is a liquid at room temperature with a vapor pressure of 69.3 Torr at 60° C., thus enabling transportation of the TMA gas to the deposition area with argon carrier gas. TMA is mixed with argon at 0.5 slpm and carried to the central injector. The zinc sulfide is expected to be doped with 1.5 molar % of selenium and 1.5 molar % of aluminum for a total doping of 3 molar %. The deposited doped zinc sulfide is removed from the graphite mandrels and then machined, lapped and polished as in Example 2 until a scratch/dig ratio of 80/50 is achieved on the doped zinc sulfide surface. The hardness of the polished material is measured with a Knoop indentation using 50 gram load and the average hardness value is expected to be 332 Knoop. This value is larger by 51% in comparison to the baseline average zinc sulfide hardness of 220 Knoop. Thus doping of zinc sulfide with 1.5 molar % concentration each of selenium and aluminum is expected to result in a hardness increase of 51%.

The IR transmission of selenium and aluminum doped zinc sulfide is measured using an infrared spectrophotometer. No significant decrease in IR transmission in the long wave IR region 8-12 µm is expected.

EXAMPLE 4

The chemical vapor deposition of zinc sulfide is performed in the same manner as given in Example 2 except that trimethylgallium (TMG) is also passed through the central injector at 0.094 slpm and mixed with 0.5 slpm of argon inert carrier gas during deposition. TMG is a liquid at room temperature with a boiling point of 92.5° C., thus enabling transportation of the TMG gas to the deposition area with argon carrier gas. The zinc sulfide with the selenium and gallium dopants is deposited on graphite mandrels at temperatures of 690° C. and a deposition chamber pressure of 35 Torr. The zinc sulfide doped with 1.5 molar % of selenium and 1.5 molar % of gallium is removed from the graphite mandrels and then machined, lapped and polished as in Example 2 to achieve a scratch/dig ratio of 80/50. The hardness of the polished material is measured with a Knoop indentation using 50 gram load and the average hardness value expected to be 316 Knoop. This value is larger by 43% in comparison to the baseline average zinc sulfide hardness of 220 Knoop. Thus doping of zinc sulfide with 1.5 molar % concentration each of selenium and gallium is expected to result in a hardness increase of 43.5%.

The IR transmission of selenium and gallium doped zinc sulfide is measured using an IR spectrophotometer. No significant decrease in IR transmission in the long wave IR region of 8-12 µm is expected.

EXAMPLE 5

The optical properties of refractive index, reflectivity and absorption of un-doped zinc sulfide and zinc sulfide doped with 1.56 molar % selenium were compared. The comparison was done using the "Energy" task on CASTEP which is a leading code for calculating the properties of materials from first principles. Some parameters specific to the optical properties estimation were as follows.

Exchange and correlation functional: Perdew Burke Ernzerhof within generalized gradient approximation (GGA)
Ultrasoft Pseudopotentials in reciprocal space
Planewave basis set cut off energy: 310 eV
Empty band: 16
k-point setting as "Fine" quality, which is 1×1×1 for the $Zn_{32}S_{32}$ structure; and
Band energy tolerance is 1e-5 eV.

The same optical properties were also estimated for the 1.56 molar % Se doping structure of $Zn_{32}S_{31}Se_1$. The values of the optical properties were determined at the particular vibrational frequency of ~589 nm for comparison before and after the doping. The Change in the optical properties between the doped zinc sulfide and the un-doped zinc sulfide was determined as shown in the table below.

| Optical Property at 589 nm | Relative Change Due to 1.56 Molar % Selenium Doping |
|---|---|
| Refractive Index | 0.56% |
| Reflectivity | −1.03% |
| Absorption | −3.18% |

The results of the CASTEP analysis showed that doping zinc sulfide with 1.56 molar % selenium only showed minor changes in the refractive index, reflectivity and absorption properties of the zinc sulfide. The optical properties of the doped zinc sulfide were still suitable for use as windows and domes.

What is claimed is:

1. A method comprising:
   a) providing a source of zinc, a source of sulfur and a source of one or more dopants chosen from selenium and silicon;
   b) injecting the source of zinc as a gas at 0.2 to 1 slpm, the source of sulfur as a gas at 0.1 to 0.9 slpm and the one or more sources of selenium and silicon as a gas at 0.01 slpm to 0.1 slpm into a chemical vapor deposition chamber comprising an inert gas, the pressure in the chemical vapor deposition chamber ranges from 20 to 50 Torr; and
   c) chemical vapor depositing one or more layers of a composition comprising zinc sulfide and 0.5 molar % to 10 molar % of one or more of the dopants chosen from selenium and silicon on a substrate, a temperature of the substrate is from 600° C. to 800° C.

2. The method of claim 1, further comprising treating the composition comprising zinc sulfide and 0.5 molar % to 10 molar % of one or more of the dopants chosen from selenium and silicon by a HIP process.

* * * * *